US006433400B1

(12) United States Patent
Gardner et al.

(10) Patent No.: US 6,433,400 B1
(45) Date of Patent: *Aug. 13, 2002

(54) SEMICONDUCTOR FABRICATION EMPLOYING BARRIER ATOMS INCORPORATED AT THE EDGES OF A TRENCH ISOLATION STRUCTURE

(75) Inventors: Mark I. Gardner, Cedar Creek; H. Jim Fulford; Derick J. Wristers, both of Austin, all of TX (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/153,753

(22) Filed: Sep. 15, 1998

Related U.S. Application Data

(62) Division of application No. 08/923,184, filed on Sep. 4, 1997, now Pat. No. 5,854,121.

(51) Int. Cl.[7] .......... H01L 29/36
(52) U.S. Cl. .......... 257/514; 257/506; 257/647
(58) Field of Search .......... 257/509, 510, 257/506, 649, 648, 647, 519; 438/423, 424, 425; 251/513–515

(56) References Cited

U.S. PATENT DOCUMENTS 5,372,950 A * 12/1994 Kim et al. .......... 437/24
5,387,540 A * 2/1995 Poon et al. .......... 437/67
5,461,253 A * 10/1995 Tsuruta et al. .......... 257/501
5,473,186 A * 12/1995 Morita .......... 257/519
5,506,168 A 4/1996 Morita et al.
5,545,290 A 8/1996 Douglas
5,729,043 A * 3/1998 Shepard .......... 257/519
5,798,553 A * 8/1998 Furukawa et al. .......... 257/394
5,811,347 A * 9/1998 Gardner et al. .......... 438/435
5,837,612 A * 11/1998 Ajuria et al. .......... 438/697
5,891,787 A * 4/1999 Gardner et al. .......... 438/424
5,904,538 A * 5/1999 Son et al. .......... 438/424
5,943,585 A * 8/1999 May et al. .......... 438/400

* cited by examiner

*Primary Examiner*—David Hardy
(74) *Attorney, Agent, or Firm*—Kevin L. Daffer; Conley, Rose & Tayon

(57) ABSTRACT

A method for isolating a first active region from a second active region, both of which are configured within a semiconductor substrate. The method comprises forming a dielectric masking layer above a semiconductor substrate. An opening is then formed through the masking layer. A pair of dielectric spacers are formed upon the sidewalls of the masking layer within the opening. A trench is then etched in the semiconductor substrate between the dielectric spacers. A first dielectric layer is then thermally grown on the walls and base of the trench. A CVD oxide is deposited into the trench and processed such that the upper surface of the CVD oxide is commensurate with the substrate surface. Portions of the spacers are also removed such that the thickness of the spacers is between about 0 to 200 Å. The semiconductor topography is then exposed to a barrier-entrained gas and heated so that barrier atoms become incorporated in regions of the active areas in close proximity to the trench isolation structure. The masking layer may prevent the barrier atoms from being incorporated into any other regions of the substrate.

8 Claims, 5 Drawing Sheets

SEMICONDUCTOR FABRICATION EMPLOYING BARRIER ATOMS INCORPORATED AT THE EDGES OF A TRENCH ISOLATION STRUCTURE

This is a Division of application Ser. No. 08/923,184, filed Sep. 4, 1997, now U.S. Pat. No. 5,854,121.

BACKGROUND OF THE INVENTION

1. Field of the Invention

This invention relates to integrated circuit fabrication and, more particularly, to an improved process of incorporating barrier atoms within active areas of a semiconductor substrate laterally adjacent to a trench isolation structure to enhance properties of the isolation structure and of transistors within the active areas.

2. Description of the Relevant Art

The fabrication of an integrated circuit involves placing numerous devices in a single semiconductor substrate. Select devices are interconnected by conductors which extend over a dielectric that separates or "isolates" those devices. Implementing an electrical path across a monolithic integrated circuit thus involves selectively connecting devices which are isolated from each other. When fabricating integrated circuits it is therefore necessary to isolate devices built into the substrate from one another. From this perspective, isolation technology is one of the critical aspects of fabricating a functional integrated circuit.

A popular isolation technology used for a MOS integrated circuit involves the process of locally oxidizing silicon. Local oxidation of silicon, or LOCOS processing involves oxidizing field regions of a silicon-based substrate between device areas. The oxide grown in the field or isolation regions is termed "field oxide". The field oxide is grown during the initial stages of integrated circuit fabrication, before source and drain implants are placed in device areas or active areas. By growing a thick field oxide in field regions pre-implanted with a channel-stop dopant, LOCOS processing serves to prevent the establishment of parasitic channels in the field regions.

While LOCOS has remained a popular isolation technology, there are several problems associated with LOCOS. First, a growing field oxide extends laterally as a bird's-beak structure. In many instances, the bird's-beak structure can unacceptably encroach into the device active area. Second, the pre-implanted channel-stop dopant redistributes during the high temperatures associated with field oxide growth. Redistribution of channel-stop dopant primarily affects the active area periphery, causing problems known as narrow-width effects. Third, the thickness of field oxide causes large elevational disparities across the semiconductor topography between field and active regions. Topographical disparities cause planarity problems which become severe as circuit critical dimensions shrink. Lastly, thermal oxide growth is significantly thinner in small field regions(i.e., field areas of small lateral dimension) relative to large field regions. In small field regions, a phenomenon known as field-oxide-thinning effect therefore occurs. Field-oxide-thinning produces problems with respect to field threshold voltages, interconnect-to-substrate capacitance, and field-edge leakage in small field regions between closely spaced active areas.

Many of the problems associated with LOCOS technology are alleviated by an isolation technique known as the "shallow trench process". The shallow trench process is particularly suited for isolating densely spaced active devices having field regions less than one micron in lateral dimension. Conventional trench processes involve the steps of etching a silicon substrate surface to a relatively shallow depth, e.g., between 0.2 to 0.5 microns, and then refilling the shallow trench with a deposited dielectric. The trench is then planarized to complete formation of the isolation structure. The trench process eliminates bird's-beak and channel-stop dopant redistribution problems. In addition, the isolation structure is fully recessed, offering at least a potential for a planar surface. Still further, field-oxide thinning is reduced in narrow isolation spaces, and the threshold voltage is constant as a function of channel width.

While the conventional trench isolation process has many advantages over LOCOS, the trench process also has problems. Because trench formation involves etching of the silicon substrate, it is believed that dangling bonds and an irregular grain structure form in the silicon substrate near the walls of the trench. Such dangling bonds may promote trapping of charge carriers within the active areas of an operating transistor. As a result, charge carrier mobility may be hindered, and the output current, $I_D$, of the transistor may decrease to an amount at which optimum device performance is unattainable.

Further, during subsequent anneal steps (e.g., thermal oxidation for gate oxide formation), the irregular grain structure may provide migration avenues through which oxygen atoms can pass from the field oxide to the active areas. Moreover, the dangling bonds may provide opportune bond sites for diffusing oxygen atoms, thereby promoting accumulation of oxygen atoms in the active areas near the edges of field oxide. Oxygen atoms present in active areas of the silicon may function as electron donors. Thus, inversion of silicon may occur in subsequently formed p-type active areas near the walls of the isolation trench. Further, the edge of a device may not conduct as much current as the interior portion of the device. Therefore, more charge to the gate of a transistor may be required to invert the channel than if no inversion occurred, causing threshold voltage, $V_T$, to shift undesirably from its design specification.

In a subsequent processing step the semiconductor topography may be subjected to a high temperature anneal to activate impurity species in the active areas and to annihilate crystalline defect damage of the substrate. Unfortunately, impurity species, such as boron, in the active areas may undergo diffusion into the isolation region when subjected to high temperatures. As a result, the threshold voltage in the isolation region may decrease. Thus, migration of impurities into the isolation region may lead to current inadvertently flowing between active areas, defeating the purpose of having the trench isolation region in the first place.

It is therefore desirable to develop a technique for forming a trench isolation structure between active areas in which problems related to dangling bonds and irregular grain structure in the active areas are alleviated. Such a technique is necessary to inhibit charge carriers and oxygen donors from being entrapped in the active areas. Yet further, it is desirable that impurity species be prevented from migrating into the trench isolation structure so that current leakage between active areas may be inhibited.

SUMMARY OF THE INVENTION

The problems noted above are in large part solved by the method hereof for isolating active areas within a semiconductor substrate. That is, the present invention contemplates the formation of a trench isolation structure between active areas of a semiconductor substrate. Advantageously, barrier atoms are incorporated in the active areas adjacent to the walls of the trench to enhance the properties of both the isolation structure and of device performance within the active areas adjacent the isolation structures.

According to an embodiment of the present invention, a semiconductor topography is provided in which a masking layer is formed above a semiconductor substrate. An opening is formed vertically through the masking layer, and a dielectric spacer material is deposited across the exposed surface of the topography. The spacer material is then anisotropically etched to form spacers directly adjacent to opposed sidewall surfaces of the masking layer opening. The spacers are strategically placed above regions of the substrate into which barrier atoms are to be subsequently incorporated. An isolation trench is then etched into the semiconductor substrate between the spacers. The resulting trench is relatively shallow and is interposed between ensuing active areas of the semiconductor substrate.

An oxide (i.e., $SiO_2$) layer may be thermally grown within the trench on the exposed edges of the substrate. Oxide may then be deposited using chemical vapor deposition ("CVD") into the trench and across the masking layer surface. Chemical-mechanical polishing may be used to planarize the upper surface of the masking layer. The oxide may then be etched down to an elevation commensurate with the upper surface of the semiconductor substrate. The spacers may be concurrently etched down to near the surface of the substrate. The resulting trench isolation region includes both a thermally grown oxide and a deposited oxide. As described previously, a shallow isolation trench which is filled with a deposited oxide has many benefits over LOCOS isolation structures. However, deposited oxide is generally less dense than thermally grown oxide and has an altered stoichiometry that can cause changes in the mechanical and electrical properties of the film. Thermally grown oxide, on the other hand, has a generally uniform stoichiometry arranged for consistent electrical isolation. Accordingly, thermally grown oxide is strategically arranged at the periphery of the trench adjacent to the active areas which require electrical isolation. The remaining bulk of the isolation structure is CVD oxide.

The semiconductor topography is then exposed to thermal radiation in a barrier-entrained ambient. As a result, barrier atoms, e.g., nitrogen atoms, migrate into exposed areas of the semiconductor topography, particularly into areas of the semiconductor substrate directly under the spacers and adjacent to the walls of the trench. The masking layer inhibits the barrier atoms from diffusing into other regions of the substrate. The spacers are thin enough to allow barrier atoms to pass through them to the substrate therebelow. The masking layer and any remaining portions of the spacers are removed in preparation for the growth of a gate oxide across the substrate.

Barrier atoms thusly placed in the semiconductor substrate contribute many useful features to active area isolation. They may fill voids in an irregular grain structure which may have resulted when etching the trench. The barrier atoms may also bond with available silicon atoms such that opportune bond sites no longer exist. Further, the barrier atoms may fill interstitial sites between silicon atoms. Thus, barrier atoms may block grain-boundary diffusion pathways into and out or the active areas. Therefore, impurities are inhibited from passing into the field oxide and oxygen atoms are inhibited from passing into the active areas. Problems associated with these occurrences, such as current leakage between active areas and edge inversion of a transistor may be prevented. Moreover, charge carrier entrapment in the active areas may be reduced since barrier atoms have terminated many of the dangling bonds. Since Si—N bonds are stronger and less strained than Si—O bonds, nitrogen barrier atoms are better suited for inhibiting the immobility of charge carriers near the edges of a transistor.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1:
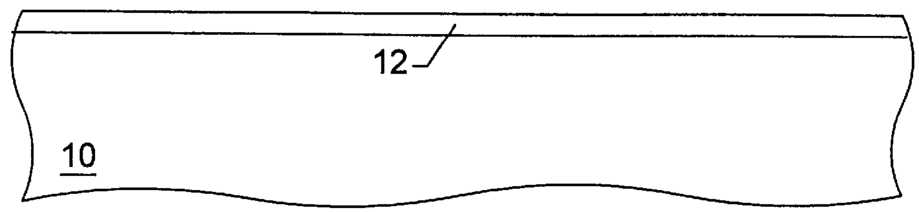
FIG. 1 is a partial cross-sectional view of a semiconductor topography, wherein an oxide layer is grown across a semiconductor substrate.
Figure 2:
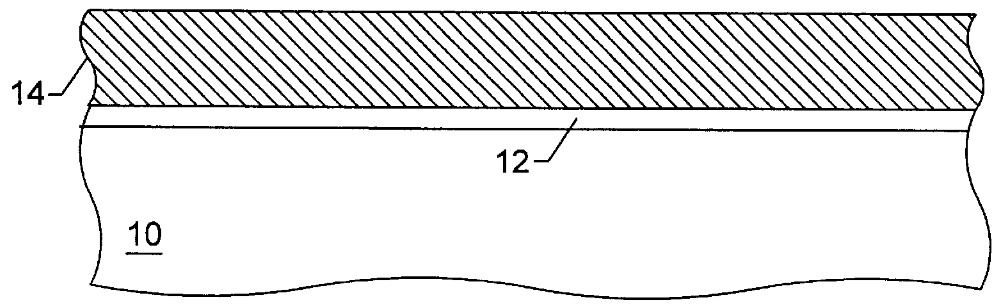
FIG. 2 is a cross-sectional view of the semiconductor topography, wherein a dielectric masking layer is deposited across the oxide layer, subsequent to the step in FIG. 1.
Figure 3:
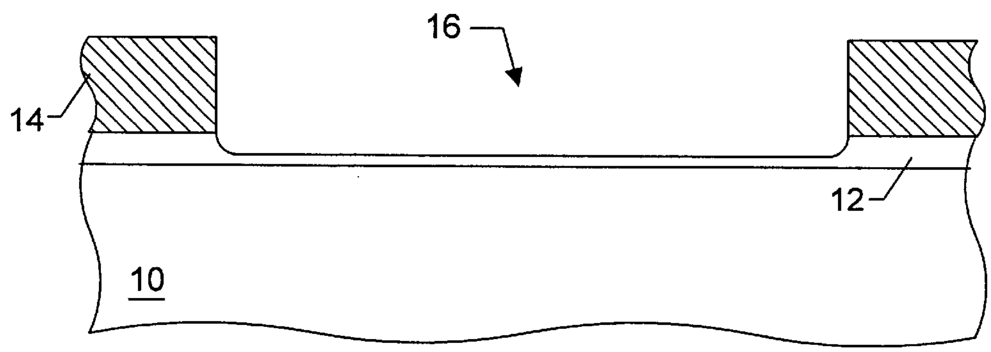
FIG. 3 is a cross-sectional view of the semiconductor topography, wherein an opening is etched vertically through the masking layer and partially through the oxide layer, subsequent to the step in FIG. 2.

Turning now to the drawings, FIG. 1 depicts a semiconductor substrate 10 across which a thin layer of thermally grown oxide 12 is disposed. Semiconductor substrate 10 comprises single crystalline silicon. As shown in FIG. 2, a dielectric masking layer 14, preferably nitride ($Si_3N_4$), may be deposited across oxide layer 12. The nitride deposition may be performed using, e.g., a horizontal tube LPCVD reactor. Oxide layer 12 is used as a "pad oxide" to reduce inherent stresses that exist between CVD nitride on silicon. FIG. 3 depicts the etching of a contiguous opening 16 through masking layer 14 and partially through oxide layer 12. A dry, plasma etch technique may be used to form opening 16 in which etch duration is chosen to terminate just before reaching the surface of substrate 10. It is also possible to etch through the entire thickness of oxide layer 12, but overetching may result in unwanted removal of the underlying substrate 10.

Figure 4:
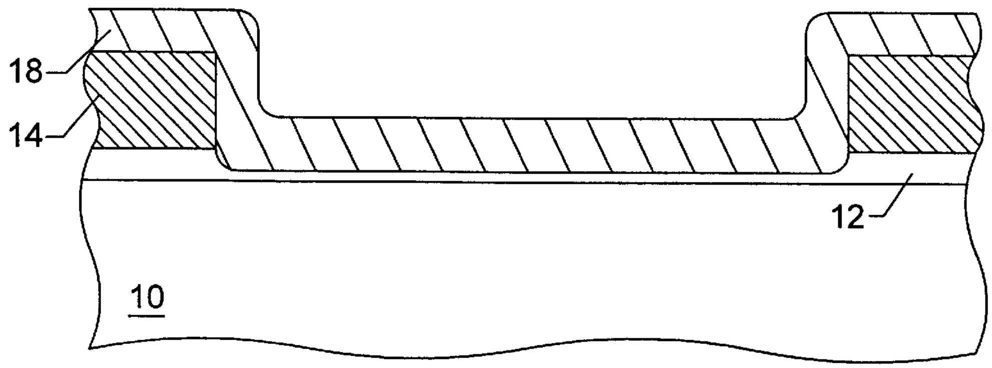
FIG. 4 is a cross-sectional view of the semiconductor topography, wherein a dielectric material is deposited across the exposed surface of the topography, subsequent to the step in FIG. 3.
Figure 5:
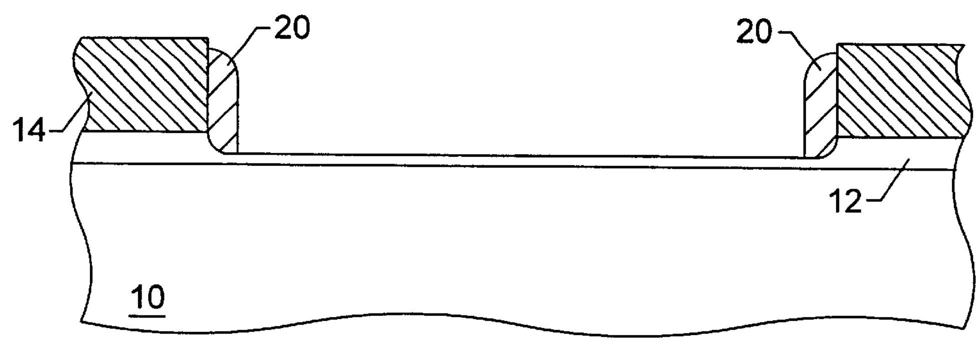
FIG. 5 is a cross-sectional view of the semiconductor topography, wherein the dielectric material is anisotropically etched to form spacers adjacent to sidewalls of the masking layer opening, subsequent to the step in FIG. 4.

FIG. 4 illustrates the chemical vapor deposition of a dielectric material 18, e.g., oxide, nitride, or oxynitride, across the exposed surfaces of masking layer 14 and oxide layer 12. Dielectric material 18 may be anisotropically etched to form spacers 20 which are depicted in FIG. 5. Since anisotropic etch removes material at a faster rate vertically than horizontally, etch duration is chosen to terminate before bombarding etchant ions may attack a predetermined thickness of the dielectric material disposed immediately adjacent to the sidewall surfaces of masking layer 14. Preferably the thickness of the each of the remaining spacers 20 is about 0.1 micron in the lateral (horizontal direction).

Figure 6:
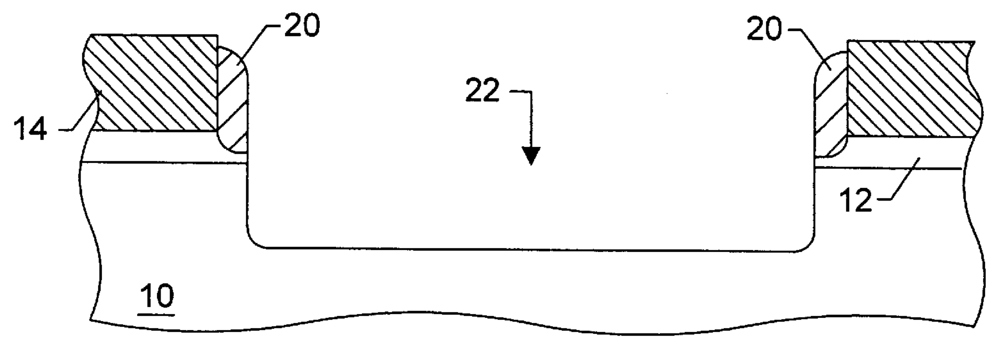
FIG. 6 is a cross-sectional view of the semiconductor topography, wherein a trench is etched in a region of the substrate defined between the spacers, subsequent to the step in FIG. 5.
Figure 7:
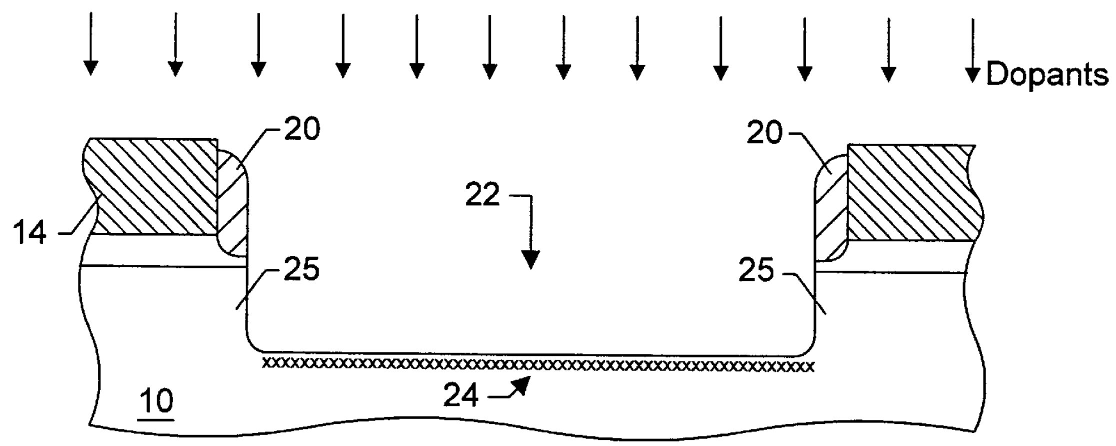
FIG. 7 is a cross-sectional view of the semiconductor topography, wherein a channel-stop implant is forwarded into a region of the substrate underlying the trench, subsequent to the step in FIG. 6.

Turning to FIG. 6, a trench 22 may be anisotropically etched in a region of substrate 10 defined between spacers 20. Prior to etching substrate 10, a photoresist masking layer (not shown) may be patterned directly above masking layer 14 and spacers 20 using well known optical lithography techniques to prevent removal of these structures during the etch process. FIG. 7 depicts dopants being implanted into a region 24 of substrate 10 directly below trench 22. Masking layer 14 and spacers 20 prevent implants from entering material beneath those regions. Only the trench 24 exposed between spacers 20 receives the blanket implant. This implant is performed to create a channel-stop doping layer under the ensuing field oxide. The type of dopants chosen for the channel-stop implant is opposite to that used during a later implant into active areas 25 which are separated by trench 22. A $p^+$ implant of boron or an $n^+$ implant of arsenic may, e.g., be used.

Figure 8:
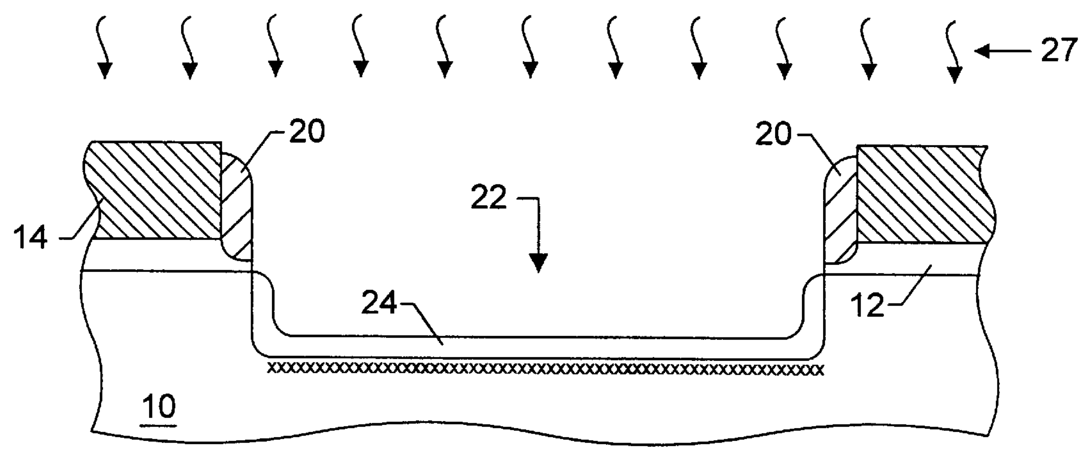
FIG. 8 is a cross-sectional view of the semiconductor topography, wherein a layer of oxide is thermally grown across the walls and the base of the trench, subsequent to the step in FIG. 7.
Figure 9:
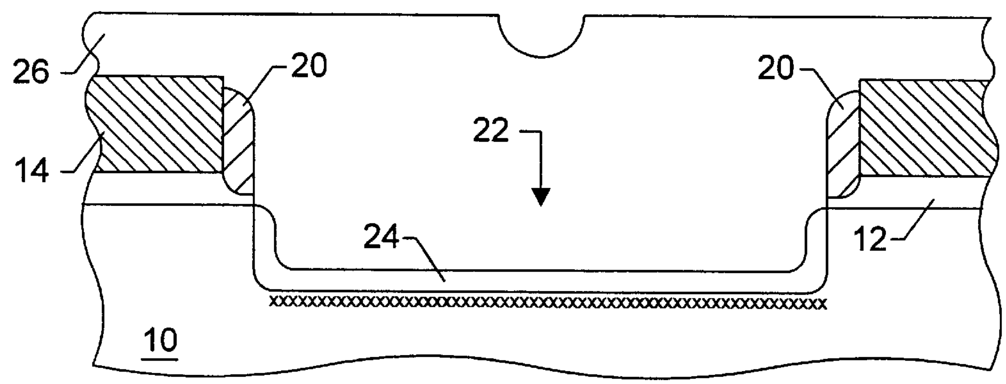
FIG. 9 is a cross-sectional view of the semiconductor topography, wherein a dielectric is deposited across the topography up to an elevation which is a spaced distance above the surface of the masking layer, subsequent to the step in FIG. 8.
Figure 10:
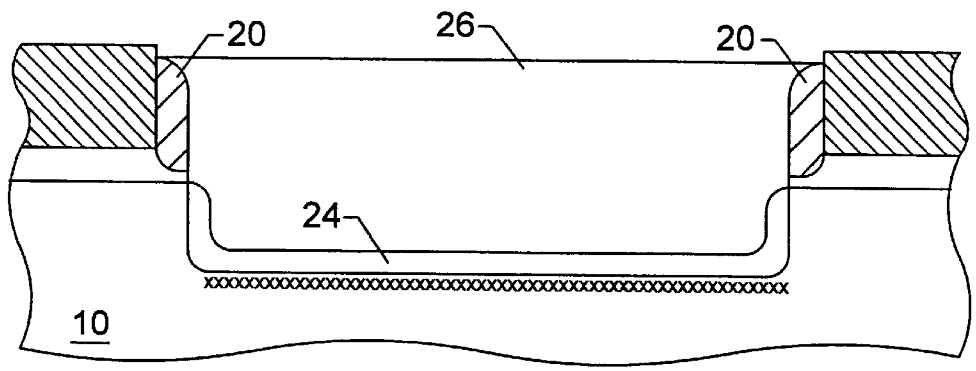
FIG. 10 is a cross-sectional view of the semiconductor topography, wherein the deposited dielectric is concurrently planarized and removed down to an elevation near the surface of the masking layer, subsequent to the step in FIG. 9.

As shown in FIG. 8, the semiconductor topography is then exposed to thermal radiation 27, resulting in the oxidation of the exposed silicon within substrate 10. A thermally grown oxide layer 24 is thusly formed which lines the walls and the base of trench 22. FIG. 9 depicts the deposition of a fill dielectric material 26, e.g., CVD oxide into trench 22. The fill oxide 26 is deposited until the upper surface of the material is at an elevation above the surface of masking layer 14. Subsequently, chemical-mechanical polishing (CMP), or a combination of etchback and/or CMP may be used to simultaneously planarize the upper surface of fill oxide 26 and remove the material down to an elevation proximate the peaks of spacers 20 as shown in FIG. 10.

Figure 11:
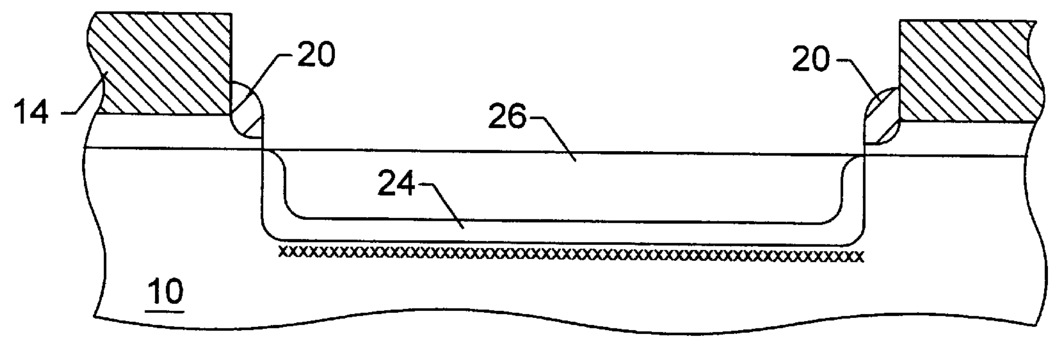
FIG. 11 is a cross-sectional view of the semiconductor topography, wherein the deposited dielectric and the spacers are etched such that the upper surface of the dielectric is level with the surface of the substrate, subsequent to the step in FIG. 10.

Turning to FIG. 11, fill oxide 26 may then be etched such that its upper surface is commensurate with the surface of substrate 10. A photoresist masking layer may be patterned above masking layer 14 to prevent removal of masking layer 14 during the etch process. Fill oxide 26 combined with oxide layer 24 form a trench isolation structure. Spacers 20 are concurrently etched along with fill oxide 26 such that they each have a thickness of between 0 to 200 Å, depending on the etch process used and the type of spacer material. For example, if a dry, plasma etch which has low selectivity relative to oxide is used to etch fill oxide 26, almost all of spacers 20 may be removed. A large portion of spacers 20 may also be removed using an etch step that is highly selective to oxide if the spacers are composed of oxide. Conversely, if spacers 20 are made of oxynitride or nitride and a highly oxide selective etch is used, less of the spacers 20 may be removed. Nitride spacers would be thicker than oxynitride spacers after an oxide selective etch, e.g., a wet etch process using a hydrofluoric acid solution. A relatively short or thin residual spacer is deemed important in allowing barrier atoms to ingress into the substrate directly beneath the spacer, as described below.

Figure 12A:
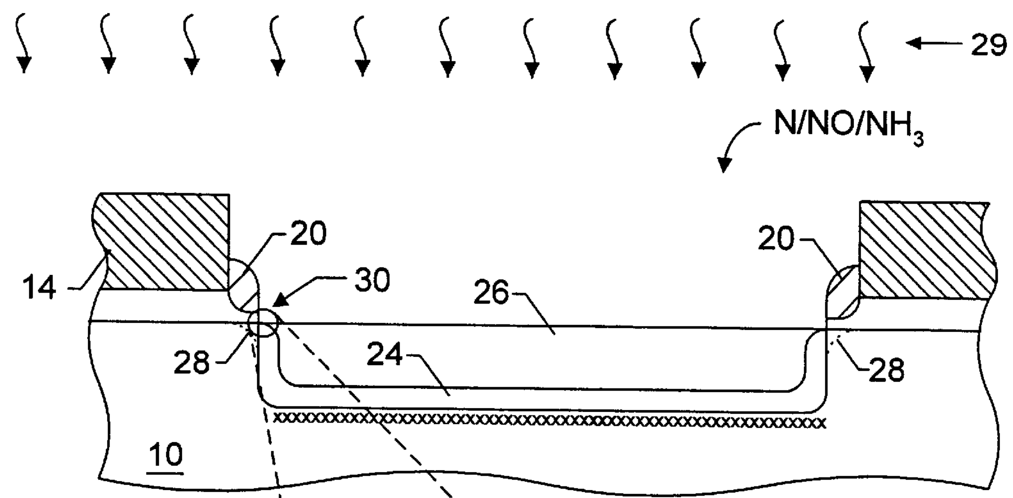
FIG. 12*a* is a cross-sectional view of the semiconductor topography, wherein the topography is exposed to thermal radiation in an ambient containing barrier atoms, subsequent to the step in FIG. 11.

As depicted in FIG. 12*a*, the semiconductor topography may be concurrently subjected to thermal radiation 29 and to a barrier-entrained gas. This annealing step may be performed using Rapid Thermal Processing ("RTP") which provides for anneal of implantations with minimal impurity redistribution. The barrier-entrained gas may contain compounds having barrier atoms. Preferably, the gas contains nitrogen bearing compounds. Thermal radiation 29 may cause the nitrogen atoms to migrate from the gaseous material to regions 28 of substrate 10 disposed directly under spacers 20. Masking layer 14 inhibits nitrogen atoms from passing to other regions of substrate 10. Nitrogen atoms may also migrate into fill oxide 26 and thermally grown oxide 24 and become incorporated near the surface of the trench isolation structure. Spacers 20 are strategically disposed above regions 28 and between masking layer 14 and the trench isolation structure. Since a large portion of spacers 20 have been removed from the sidewalls of masking layer 14, nitrogen atoms may migrate through the relatively thin spacers 20 to regions 28 which are disposed in close proximity to the trench isolation structure.

Figure 12B:
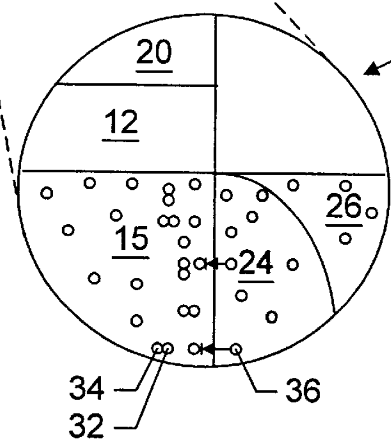
FIG. 12*b* is a detailed view along section 30 of FIG. 12*a*, wherein barrier atoms are incorporated into active areas of the substrate laterally adjacent to the isolation trench structure.

FIG. 12*b* depicts a detailed view along section 30 of FIG. 12*a*. Nitrogen atoms 32 migrate mostly through spacer 20 and oxide layer 12 to active region 15 of substrate 10. Active area 15 may form a source and drain region of a transistor in subsequent processing steps. Nitrogen atoms 32 are shown as being incorporated through the corner region of active area 15 in close proximity to the thermal oxide 24/active area 15 interface. Nitrogen atoms 32 may bond with available silicon atoms 34 near the interface and accumulate at dangling bond sites. Nitrogen atoms 32 may also fill voids and interstitial sites within active area 15. Thus, in subsequent processing when the semiconductor topography is exposed to heat, nitrogen atoms 32 may block or "stuff" migration pathways of oxygen atoms 36 from the isolation structure into active area 15. The nitrogen atoms 32 may also block impurity species in active area 15 from passing to the trench isolation structure. Further, since Si—N bonds are relatively strong, the possibility of species such as charge carriers becoming trapped by dangling bonds is reduced.

Figure 13:
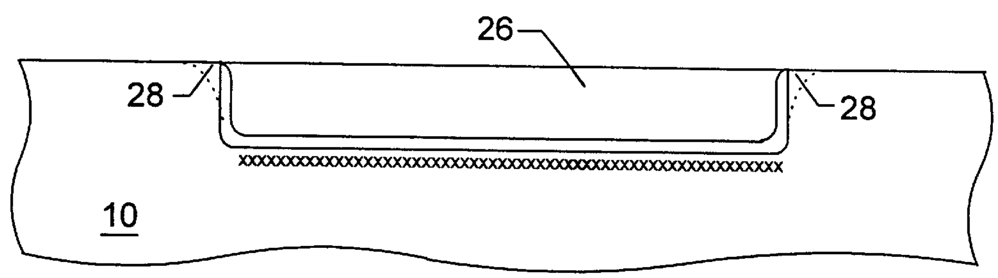
FIG. 13 is a cross-sectional view of the semiconductor topography, wherein the masking layer, the oxide layer, and the spacers are removed from the upper surface of the substrate, subsequent to the step in FIG. 12*a*.

After incorporating nitrogen atoms into regions 28 of active areas 15, the semiconductor topography undergoes preparation for subsequent formation of transistors which are to be isolated from each other by the trench isolation structure. As shown in FIG. 13, masking layer 14, spacers 20, and oxide layer 12 may be etched away. They may be removed using, e.g., various wet etch techniques. For example, if masking layer 14 and spacers 20 are composed of nitride, these structures may be etched using reflux boiled phosphoric acid. Oxide layer 12 may then be removed using a hydrofluoric acid solution as the etchant.

It will be appreciated to those skilled in the art having the benefit of this disclosure that this invention is believed to provide a method for forming actives areas isolated from each other by a trench isolation structure in which the isolation structure and devices employing the active areas have enhanced properties. It is intended that the following claims be interpreted to embrace all such modifications and changes and, accordingly, the specification and drawings are to be regarded in an illustrative rather than a restrictive sense.

What is claimed is:

1. An isolation structure laterally disposed between a first active region and a second active region of a semiconductor substrate, comprising:

a trench configured within said semiconductor substrate;

a thermally grown oxide layer having a first portion disposed across a bottom of said trench and second and third portions disposed within said trench laterally adjacent to said first and second active regions; and a deposited oxide disposed within said trench above said first portion and between said second and third portions, said deposited oxide having an upper surface which is approximately coplanar with an upper surface of said semiconductor substrate; and barrier atoms incorporated exclusively into barrier regions of said first and second active regions, wherein the barrier regions are proximate said upper surface of said substrate and laterally adjacent to said second and third portions of said thermally grown oxide, and wherein the barrier regions are of limited lateral extent within the active regions, such that a depth to which said barrier atoms are incorporated within each active region is greatest at an interface between the active region and the adjacent portion of the thermally grown oxide, and decreases with distance into the active region and away from the interface.

2. The isolation structure of claim 1, wherein said semiconductor substrate comprises single crystalline silicon.

3. The isolation structure of claim 1, wherein said barrier atoms are nitrogen atoms, and wherein said nitrogen atoms are bonded to silicon atoms within said semiconductor substrate.

4. The isolation structure of claim 1, further comprising a channel-stop doping layer located below said thermally grown oxide layer.

5. The isolation structure of claim 1, further comprising a laterally spaced pair of residual spacers abutting opposed sidewalls of said trench.

6. The isolation structure of claim 1, wherein said barrier atoms comprise nitrogen atoms.

7. The isolation structure of claim 1, wherein said barrier atoms comprise atoms positioned within voids in a grain structure of the active regions.

8. The isolation structure of claim 1, wherein said barrier atoms comprise atoms positioned within interstitial sites between silicon atoms of the active regions.

* * * * *